Feb. 27, 1962 R. W. FRITTS 3,023,257

THERMOELECTRIC GENERATOR

Filed May 29, 1958

INVENTOR.
Robert W. Fritts,
BY Brown, Jackson,
Boettcher & Dienner Attys.

United States Patent Office 3,023,257

Patented Feb. 27, 1962

3,023,257
THERMOELECTRIC GENERATOR

Robert W. Fritts, St. Paul, Minn., assignor by mesne assignments, to Minnesota Mining and Manufacturing Company, St. Paul, Minn., a corporation of Delaware Filed May 29, 1958, Ser. No. 738,866
6 Claims. (Cl. 136—4)

My present invention relates to thermoelectric generators, and more particularly to thermoelectric generators adapted, by way of example, of utilizing solar energy for heating the hot thermojunction means of thermoelectric element means of the generator.

The efficient conversion of solar energy into other forms of energy has long been a problem and many approaches in that regard have been made. So far as I am aware, the art has not successfully provided a thermoelectric generator suitable for efficiently converting solar energy in the form of the sun's rays to electrical energy, and, accordingly, it is an important object of my present invention to provide a thermoelectric generator construction which is effective and efficient in that regard.

A further object of my invention is to provide a thermoelectric generator comprising parabolic reflector means, and thermoelectric element means associated with the reflector means to provide for the utilization of an external energy source to heat the hot thermojunction means of the generator.

A further object is to provide a thermoelectric generator in which the parabolic reflector means comprises a plurality of parabolic reflector segments, and a plurality of thermoelectric element means, one each of the latter being operatively associated with one each of the parabolic reflector segments for heating of the hot thermojunction means of thermoelectric element means of the generator.

A further object is to provide a thermoelectric generator comprising thermoelectric element means, and parabolic reflector means for focusing radiant energy to heat the hot thermojunction means of the thermoelectric element means, together with means for preventing radial heat loss from the hot thermojunction means to maintain the hot thermojunction means at maximum temperature.

A further object is to provide a thermoelectric generator comprising thermoelectric element means, and parabolic reflector means in which the reflector means affords dissipation of heat by conduction and radiation at the cold thermojunction means of the thermoelectric element means to provide for maintaining a maximum temperature differential between the hot and cold thermojunction means for maximum efficiency in the conversion of heat to electricity.

A further object is to provide an assembly including thermoelectric generator means having hot and cold thermojunction means, and parabolic reflector means, the area of the parabolic reflector means being large compared to the area of the generator means, and the parabolic reflector means and said thermoelectric generator means being arranged so that the parabolic means collects a large area of incident radiation and focuses the same in the hot thermojunction means, and in which the focused energy is transferred through the thermoelectric generator means and cold thermojunction means to the large area of the parabolic reflector means to afford the thermoelectric generator means a large temperature differential between the hot and cold thermojunctions and consequent efficient operation.

A further object is to provide, in a generator as aforesaid, a thermoelectric assembly for mounting in a parabolic reflector including a hermetic enclosure for the thermoelectric element means of the thermoelectric assembly, and in which the enclosure includes window means adjacent the hot thermojunction means for the thermoelectric element means for transmitting solar or radiant energy to the hot thermojunction means.

A further object is to provide a generator as last aforesaid in which the thermoelectric assembly comprises a plurality of alternate positive and negative thermoelectric elements, together with hot and cold thermojunction members for electrically connecting the thermoelectric elements in series relation to afford maximum output for the thermoelectric assembly.

It is a further object of my invention to provide a thermoelectric generator of the character above indicated in which the parabolic reflector comprises a plurality of parabolic segment members, and at the adjoined or abutting edges of each pair of segment members to dispose a thermoelectric assembly including thermoelectric element means having hot and cold thermojunction members, and arranged so that the hot thermojunction members are disposed substantially at the focal point of solar rays or radiant energy parallel to the axis of the reflector of each parabolic segment members opposite each thermoelectric assembly.

It is a further object to provide a generator as last aforesaid in which the several thermoelectric assemblies each afford for the hermetic sealing of the thermoelectric element means.

A further object is to provide a generator as last aforesaid in which the thermoelectric assembly means includes an enclosure in heat conductive relation between the cold thermojunction members and the reflector segments.

A still further object is to provide a generator comprising an odd number of parabolic segment members joined as aforesaid, and with there being a thermoelectric assembly of the character above indicated at the adjoining or abutting edges of each adjacent pair of parabolic segment members.

The above and further objects and advantages of my invention will appear from the following detailed description of a preferred embodiment of my invention.

Now in order to acquaint those skilled in the art with the manner of constructing and utilizing a generator in accordance with my present invention, I shall describe in connection with the accompanying drawing a preferred embodiment of my invention.

Figures 1, 2, 3, 4:
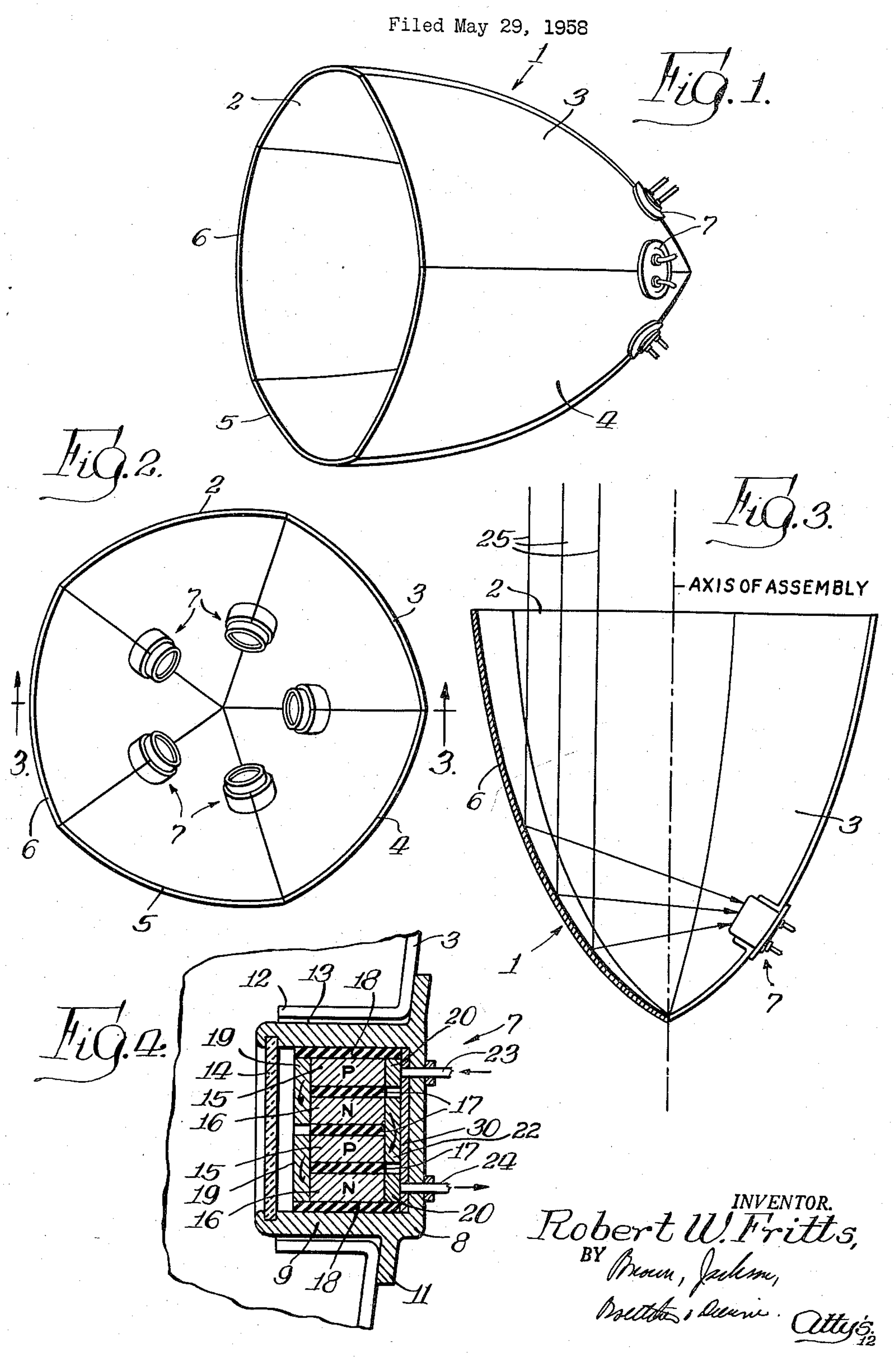
FIGURE 1 is a largely diagrammatic perspective view of a thermoelectric generator constructed in accordance with the principles of my invention.
FIGURE 2 is an end view looking into the open end of the reflector of the generator shown in FIGURE 1.

FIGURE 3 is a cross-sectional view through the generator of FIGURES 1 and 2, with the view being taken substantially along the line 3—3 of FIGURE 2 looking in a direction indicated by the arrows; and FIGURE 4 is an enlarged detail sectional view showing a portion of one of the reflector segments of the generator illustrated in FIGURES 1 through 3, and illustrating, in section, one of several like thermoelectric assemblies embodied in the generator.

Referring now to the drawings, and more particularly the FIGURES 1 through 3, it will be observed that I have shown a thermoelectric generator indicated generally at 1, which comprises a plurality of parabolic segment members 2 through 6. Any suitable number of parabolic reflector segment members may be employed, but as will appear below it is preferable that an odd number of parabolic reflector segment members be utilized to afford for appropriate positioning in the reflector of a plurality of like thermoelectric assemblies indicated generally at 7.

The several thermoelectric assemblies 7, as shown, are mounted one each between the abutting or adjoining edges of adjacent pairs of parabolic segment members 2 through 6. As best seen in FIGURE 4 each thermoelectric assembly 7 comprises an enclosure or housing 8 including a collar 9 and an outer end wall having a peripheral flange portion 11. The several parabolic reflector members 2 through 6, at the adjacent abutting edges of each pair thereof, are formed with inwardly extending wall members 12 which, with the segment members assembled, afford or define an opening 13 into which the collar 9 of the thermoelectric assembly 7 is positioned in spaced relation by the mounting of flange 11 to the adjacent external wall portion of the adjacent segment members as best shown in FIGURE 4.

Each thermoelectric assembly 7 further comprises an inner end window 14 suitably mounted in hermetically sealed relation at the inner end of collar 9 as by spinning over of the inner end portion of the collar. The window 14 is transparent to light rays and may, for example, be made of quartz when solar energy is used as the heat source for the generator. Each thermoelectric assembly further comprises a plurality of electrically positive thermoelectric elements 15, and a plurality of electrically negative thermoelectric elements 16, disposed in alternate relation with respect to each other, and between which there is provided layers of thermal and electrical insulating material 17. Additionally, layers of thermal and electrical insulating material 18 are arranged between the end thermoelectric elements, and the inner walls of the enclosure member 8 so that the several thermoelectric elements are insulated from each other and from the wall of enclosure 8.

As shown, electrodes or contact members 19 provide for the electrical connection of successive pairs of thermoelectric elements of alternate polarity, and such contacts or electrodes 19 further form or define hot thermojunction means or members for the generator. Also, contacts or electrodes 20 are provided for the upper positive thermoelectric element 15 and the lower negative thermoelectric element 16, as illustrated in the drawing, and an intermediate contact or electrode member 22 electrically connects the intermediate negative and positive thermoelectric element means 15 and 16. The contact or electrode elements 20 and 22 afford cold thermojunction means or members for the generator elements. Electrical conductors 23 and 24 have electrical connection, respectively, with the upper and lower cold thermojunction members 20, and the conductor members are arranged in suitably hermetically sealed relation with the enclosure so that by virtue of such sealing of the leads 20 and 24, together with the window 14, affords the hermetic sealing of the thermoelectric element means 15 and 16 together with their hot and cold thermojunction members within the enclosure 8.

It, of course, will be understood that the several parabolic segment members 2 through 6 have the inner surfaces thereof highly polished or coated to constitute mirror surfaces, and it is further preferable for reasons to follow that the outer surface be provided with a black or dark highly emissive surface finish. The several thermoelectric assemblies 7 and openings 13 therefore in the reflector segment members are arranged so that wtih the thermoelectric assemblies, mounted as illustrated in FIGURE 4, the hot thermojunction members afforded by contacts or electrodes 19 are disposed substantially at the focal point of radiant energy parallel to the axis of the reflector. As best shown in FIGURE 3, it will be seen that radiant energy, such as the sun's rays, indicated 25, impinge upon the mirrored surfaces of the reflector segments to be directed or focused at the hot thermojunction members of the several thermoelectric generator assemblies 7. Thus, as illustrated in FIGURE 3, the thermoelectric generator assembly 7 which is mounted between the abutting or adjoining edges of parabolic segment members 3 and 4 is disposed opposite the reflector surface of reflector segment member 6 so that the aforesaid radiant energy impinging upon the reflector surface 6 is caused to be directed or focused substantially at the hot thermojunction means of the thermoelectric assembly identified. Thus in the arrangement shown, a thermoelectric generator 7 is disposed opposite a reflective surface of a parabolic reflector segment so that in the construction shown comprising five parabolic segment members, there are five thermoelectric generators, one each arranged to be at the focal point of an oppositely disposed parabolic reflector member.

As illustrated in the drawing, the area of the thermoelectric generators is considerable less than the area of the parabolic reflector members.

In the preferred form of my invention, the inner surfaces of flange members 12 within which the collar 9 of each thermoelectric generator 7 is disposed, are preferably provided with mirrored or highly reflective surfaces as to prevent radial heat loss from the hot thermojunction members of the thermoelectric assemblies to maintain the temperature thereat at maximum value. Additionally, as will be seen, at the inner surface of outer end wall of enclosure 8 adjacent cold thermojunction members 20 and 22, I have provided an electrically insulating layer 30 to prevent short circuiting of the cold thermojunction members. However, the layer 30 is further characterized by being of good thermal conductivity to afford effective cooling of the cold thermojunction members. The layer 30 may constitute any suitable glass for the purpose or if desired, the inside surface of the outer end wall of enclosure 8 may be oxidized for that purpose. By virtue of the construction last described, it will be clear that the layer 30 affords a good thermal conductivity connection with the enclosure 8, and since the enclosure 8 is in good heat conducting relation through its flange 11 to the outer surfaces of the parabolic segment members, effective cooling of the cold thermojunction members by conduction and radiation through the reflector segments is afforded.

It is clear that the area at the hot thermojunctions of each thermoelectric generator 7 is considerably less than the area of the inner reflective surface of the parabolic reflector segment opposite thereto so that the parabolic reflector segment focuses a large area of incident radiant energy onto the hot thermojunction means of small area. Further the focused radiant energy passing through each of the thermoelectric generators is dissipated to parabolic reflector segments of large area and the thermoelectric generators are thus afforded a large temperature differential between the hot and cold thermojunction means, and consequently are of marked efficiency for the conversion of radiant energy to thermoelectricity.

The several reflector segments 2 through 6 may be constructed of stainless steel with highly polished or mirror inner surfaces or otherwise and suitable dark outer surfaces, as already indicated. The thermoelectric element means may constitute any suitable thermoelectric material, and in this regard reference may be had to United States Patents No. 2,811,570, No. 2,811,571 and No. 2,811,411, all owned by the assignee of the instant application, and which disclose a large number of thermoelectric element members, both positive and negative, which may be appropriately utilized in the present invention. In regard to affording efficient hot and cold thermojunction members reference may be had to United States Patent No. 2,811,569, also owned by the assignee of the instant application, which discloses and describes in detail suitable contact electrode materials for the compositions of the patents above mentioned. The disclosures of the several aforesaid patents are herewith incorporated by reference in this application. It will, of course, be understood that other suitable thermoelectric materials, hot and cold thermojunction members and various means for affording hermetic sealing of the thermoelectric element means may be resorted to without departing from the spirit and scope of my invention.

While I have shown and described what I consider to be a preferred embodiment of my invention, it will be understood that various modifications and rearrangements may be made therein without departing from the spirit and scope of my invention.

I claim:

1. In a thermoelectric generator, the combination of a plurality of parabolic segment members joined along their edges to form a parabolic reflector, a plurality of thermoelectric assemblies each mounted at the abutting edges of a separate pair of said parabolic segment members, and said thermoelectric assemblies, each comprising thermoelectric element means having hot and cold thermojunctions, each of said thermoelectric assemblies having their hot thermojunctions disposed substantially at the focus point of the parabolic segment member opposite the abutting edges between which said thermoelectric assemblies are mounted.

2. In a thermoelectric generator, the combination of a plurality of parabolic segment members joined along their edges to form a parabolic reflector, a plurality of thermoelectric assemblies each mounted at the abutting edges of a separate pair of said parabolic segment members, and said thermoelectric assemblies each comprising thermoelectric element means having hot and cold thermojunctions, each of said thermoelectric assemblies having their hot thermojunctions disposed substantially at the focus point of the parabolic segment member opposite the abutting edges between which said thermoelectric assemblies are mounted, and said cold thermojunction members being in heat conductive relation with said reflector segments.

3. In a thermoelectric generator, the combination of a plurality of parabolic segment members joined along their edges to form a parabolic reflector, a plurality of thermoelectric assemblies each mounted at the abutting edges of a separate pair of said parabolic segment members, and said thermoelectric assemblies each comprising thermoelectric element means having hot and cold thermojunctions, each of said thermoelectric assemblies having their hot thermojunctions disposed substantially at the focus point of the parabolic segment member opposite the abutting edges between which said thermoelectric assemblies are mounted, said cold thermojunction members being in heat conductive relation with said reflector segments, and said reflector segments being formed with wall means for preventing radial radiation of heat at said hot thermojunctions.

4. In a thermoelectric generator, the combination of an odd number of parabolic segment members joined along their edges to define a parabolic reflector, a thermoelectric assembly mounted at the abutting edges of each adjacent pair of said parabolic segment members, each thermoelectric assembly comprising a plurality of alternate positive and negative thermoelectric elements and a plurality of alternate hot and cold thermojunction members electrically connecting the same in series relation, and an enclosure hermetically sealing said thermoelectric elements, window means transparent to solar rays for said enclosure adjacent said hot thermojunction members, the enclosures of the thermoelectric assemblies being mounted to dispose said hot thermojunction members thereof substantially at the focus points of the parabolic segment members opposite thereto of solar rays parallel to the axis of said reflector, and said enclosure including means for connecting the cold thermojunction members in heat conductive relation with said parabolic segment members.

5. In a thermoelectric generator, the combination of an odd number of parabolic segment members joined along their edges to define a parabolic reflector, a thermoelectric assembly mounted at the abutting edges of each adjacent pair of said parabolic segment members, each thermoelectric assembly comprising a plurality of alternate positive and negative thermoelectric elements and a plurality of alternate hot and cold thermojunction members electrically connecting the same in series relation, and an enclosure hermetically sealing said thermoelectric elements, window means transparent to solar rays for said enclosure adjacent said hot thermojunction members, the enclosures of the thermoelectric assemblies being mounted to dispose said hot thermojunction members thereof substantially at the focus points of the parabolic segment members opposite thereto of solar rays parallel to the axis of said reflector, said enclosure including means for connecting the cold thermojunction members in heat conductive relation with said parabolic segment members, and said reflector segments including wall means for preventing radial radiation of heat at said hot thermojunctions.

6. An assembly comprising, a plurality of thermoelectric generators each having hot and cold thermojunction means, and parabolic reflector means having a parabolic reflector segment for each thermoelectric generator, said parabolic reflector segments being of large area relative to a small cross-sectional area of said thermoelectric generators, and each of said thermoelectric generators being mounted in said reflector means with the hot thermojunction means thereof disposed opposite and substantially at the focal point of a parabolic reflector segment to afford focusing of a large area of incident radiant energy on said hot thermojunction means, and said cold thermojunction means being in heat conductive relation with said parabolic reflector segments so that heat energy passing through said thermoelectric generators is adapted to be dissipated by said large area parabolic reflector segments to afford a substantial temperature differential between said hot and cold thermojunction means of said thermoelectric generators.

References Cited in the file of this patent

UNITED STATES PATENTS

| | | |
|---|---|---|
| 235,497 | Bell et al. | Dec. 14, 1880 |
| 588,177 | Reagan | Aug. 17, 1897 |
| 608,755 | Cottle | Aug. 9, 1898 |
| 2,432,145 | Evans | Dec. 9, 1947 |
| 2,441,672 | Ray | May 18, 1948 |
| 2,864,879 | Toulmin | Dec. 16, 1958 |

FOREIGN PATENTS

| | | |
|---|---|---|
| 695,028 | Germany | July 18, 1940 |
| 26,782 | Great Britain | Nov. 17, 1910 |
| 732,338 | France | Sept. 19, 1932 |